United States Patent
Musiol et al.

(10) Patent No.: US 6,714,068 B2
(45) Date of Patent: Mar. 30, 2004

(54) CIRCUIT CONFIGURATION WITH SELECTIVELY OPERATING AMPLIFIERS

(75) Inventors: Lothar Musiol, Tempe, AZ (US); Henning Hohmann, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/036,031

(22) Filed: Dec. 31, 2001

(65) Prior Publication Data

US 2003/0071685 A1 Apr. 17, 2003

Related U.S. Application Data

(63) Continuation of application No. PCT/DE00/02130, filed on Jun. 30, 2000.

(30) Foreign Application Priority Data

Jun. 30, 1999 (DE) .......................... 199 30 118

(51) Int. Cl.⁷ .............. H03F 1/14; H03F 3/68
(52) U.S. Cl. ....................... 330/51; 330/295
(58) Field of Search .................. 330/51, 126, 277, 330/285, 295

(56) References Cited

U.S. PATENT DOCUMENTS

| | | | |
|---|---|---|---|
| 3,345,578 A | 10/1967 | Shuda | 330/22 |
| 3,519,945 A | 7/1970 | Lawson et al. | 330/2 |
| 4,417,240 A | 11/1983 | Ahmed | 340/782 |
| 5,541,554 A | 7/1996 | Stengel et al. | 330/51 |
| 6,265,936 B1 * | 7/2001 | Heigl et al. | 330/51 |

FOREIGN PATENT DOCUMENTS

| | | |
|---|---|---|
| EP | 0 457 932 A1 | 11/1991 |
| EP | 0 648 010 A1 | 4/1995 |
| GB | 2 289 810 A | 11/1995 |
| WO | WO 98/07199 | 2/1998 |
| WO | WO 99/12174 | 11/1999 |

OTHER PUBLICATIONS

Patent Abstracts of Japan No. 01–291506 (Nakatsuka), dated Nov. 24, 1989.

* cited by examiner

*Primary Examiner*—Steven J. Mottola
(74) *Attorney, Agent, or Firm*—Laurence A. Greenberg; Werner H. Stemer; Ralph E. Locher

(57) ABSTRACT

A circuit configuration is configured such that selectively a first amplifier or a second amplifier amplifies signals. The second amplifier is operated depending on the conditions established at the input terminal of the first amplifier. A switching element has a controlled path connected to an input terminal of the second amplifier. The switching state of the switching element can be controlled by the input terminal of the first amplifier. As a result, it is possible to effect the changeover between the amplifiers with minimal outlay and without disturbing the amplifiers.

12 Claims, 1 Drawing Sheet

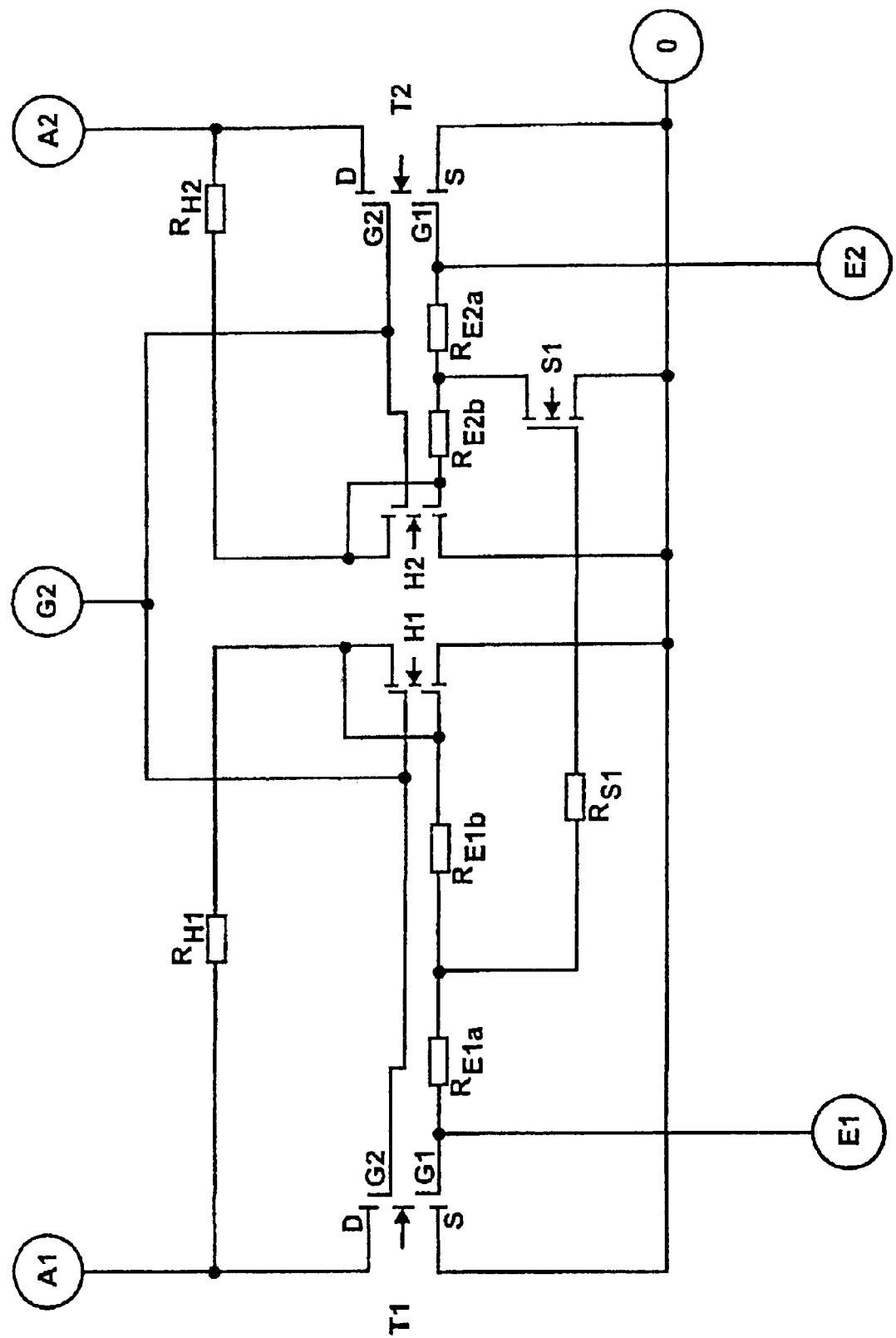

CIRCUIT CONFIGURATION WITH SELECTIVELY OPERATING AMPLIFIERS

CROSS-REFERENCE TO RELATED APPLICATION

This application is a continuation of copending International Application PCT/DE00/02130, filed Jun. 30, 2000, which designated the United States.

BACKGROUND OF THE INVENTION

FIELD OF THE INVENTION

The invention relates to a configuration having two amplifiers configured such that selectively only one of the amplifiers is intended to provide an amplification.

In existing configurations of this type, the changeover from the first amplifier to the second amplifier, or vice versa is effected using changeover devices of varying complexity. Occasionally, such a changeover device has a relatively complicated construction and, moreover, requires at least one additional (control) terminal, which may be disadvantageous in particular in the case of integrated circuits or when accommodating the configuration in a miniature housing; in particular, the required chip area and the RF properties may be adversely affected as a result.

Published British Patent Application No. GB 2 289 810 A discloses a switching device for RF signals, in which bipolar amplifier transistors are coupled to a single output at their collector and are driven by a respective RF signal at their base. For the purpose of changing over between the transistors, a control device is provided which, depending on a control signal fed to its input, generates on the output side respective switching signals which are assigned to the amplifier transistors and are coupled in at their base terminals.

Published European Patent Application No. EP 0 648 010 A discloses a differential amplifier with two emitter-coupled amplifier transistors which are connected to a supply potential terminal via a current source. Two further emitter-coupled transistors, which are connected to the supply potential terminal via a separate current source, are connected, on the one hand, by their base to the base terminals of the first-mentioned transistors and, on the other hand, by their collector in a cross-coupled manner to the base terminals of the first-mentioned transistors.

U.S. Pat. No. 4,417,240 disclose measures for generating bias voltages that are to be applied to input terminals of amplifier transistors.

SUMMARY OF THE INVENTION

It is accordingly an object of the invention to provide a circuit configuration which overcomes the above-mentioned disadvantages of the heretofore-known configurations of this general type and which allows to effect the changeover between the amplifiers with minimal additional outlay and without any disturbances.

With the foregoing and other objects in view there is provided, in accordance with the invention, a circuit configuration, including:

a first amplifier having a first controlled path connected to ground and a first terminal for receiving a signal to be amplified;

a second amplifier having a second controlled path connected to ground and a second terminal for receiving a signal to be amplified; and a switching element having a switched path with a first side connected to ground and with a second side connected to one of the first and second terminals, the switched path of the switching element being configured to be controllable by a signal present at another one of the first and second terminals.

It is provided that the second amplifier is operated depending on the conditions established at the input terminal of the first amplifier, in that a switching element connected to the signal input of one of the amplifiers is switchable in a manner dependent on a signal that is present at the signal input of the other amplifier.

If the conditions depending on which the second amplifier is operated are considered to be only those conditions which do not exhibit any interactions with the signals that are to be amplified by the first amplifier, that is to say, for example, the DC voltage established at the input terminal of the first amplifier, if the signal to be amplified is an RF signal, then the changeover between the amplifiers can be controlled via the input terminal of the first amplifier. Such a changeover can be realized extremely simply and, precisely because of this simplicity, can be effected without any problems and without any effects, or at any rate without any appreciable effects, on the function and mode of operation of the amplifiers.

According to another feature of the invention, the second amplifier is configured to be operated in dependence on a voltage level and/or a voltage profile established at the first terminal of the first amplifier.

According to yet another feature of the invention, the first and second amplifiers are configured to amplify analog AC voltages, and the second amplifier is configured to be operated in dependence on a DC voltage level established at the first terminal of the first amplifier.

According to a further feature of the invention, the first and second amplifiers are configured such that a DC voltage established at the second terminal of the second amplifier is varied depending on the DC voltage level established at the first terminal of the first amplifier.

According to another feature of the invention, a DC voltage generating circuit is connected to the first terminal of the first amplifier and to the second terminal of the second amplifier for providing DC voltages to the first and second terminals.

According to yet another feature of the invention, the DC voltage generating circuit generates the DC voltages with given values such that the first and second amplifiers are enabled to amplify signals to be amplified.

According to a further feature of the invention, the first and second amplifiers are configured such that, if a DC voltage established at the first terminal of the first amplifier has a given value at which signals to be amplified by the first amplifier can be amplified, then a DC voltage established at the second terminal of the second amplifier is left at or brought to a value at which the second amplifier is unable to amplify signals to be amplified.

According to yet a further feature of the invention, the first and second amplifiers are configured such that, if a DC voltage established at the first terminal of the first amplifier has a given value at which the first amplifier is unable to amplify signals to be amplified, then a DC voltage established at the second terminal of the second amplifier is left at or brought to a value at which the second amplifier is able to amplify signals to be amplified.

According to another feature of the invention, the first amplifier is configured such that a DC voltage established at the first terminal of the first amplifier is adjustable or variable via the first terminal for receiving signals to be amplified by the first amplifier.

According to another feature of the invention, the first amplifier is a first transistor and the second amplifiers is a second transistor; and the first amplifier has a gate terminal, the second transistor is configured to be operated in dependence of one of a voltage level and a voltage profile established at the gate terminal of the first transistor.

According to a further feature of the invention, the first amplifier is a first transistor and the second amplifiers is a second transistor; each of the first and second transistors has a first gate terminal, a second gate terminal and a controlled path; the first gate terminal of the first transistor forms the first terminal for receiving a signal to be amplified, the first gate terminal of the second transistor forms the second terminal for receiving a signal to be amplified; the second gate terminal is a terminal for setting a gain; further transistors are respectively assigned to the first and second amplifiers; each of the further transistors has a controlled path and two gate terminals; the first and second gate terminals of the first and second transistors are coupled to respective ones of the two gate terminals of the further transistors; and the controlled path of each of the further transistors is connected to ground and coupled to the controlled path of a respectively assigned one of the first and second amplifiers.

According to another feature of the invention, two series circuits are provided, each of the series circuits including two resistors and a node between the two resistors; the first and second terminals of the first and second amplifiers being coupled to respective ones of the two gate terminals of the further transistors via the two series circuits; and the switching element having a control terminal, the switched path of the switching element and the control terminal of the switching element being respectively coupled to the node of a respective one of the two series circuits.

Other features which are considered as characteristic for the invention are set forth in the appended claims.

Although the invention is illustrated and described herein as embodied in a configuration having a first amplifier and a second amplifier, of which in each case only at most one is intended to effect amplification, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The single FIGURE is a circuit diagram of a configuration according to the invention.

DESCRIPTION OF THE PREFERRED EMBODIMENTS

Referring now to the single FIGURE of the drawing in detail, there is shown a circuit diagram of a configuration according to the invention. The configuration described below is part of an integrated circuit. Although the advantages resulting from the configuration according to the invention are particularly great for the exemplary embodiment described, however the advantages are not limited to the examples described below.

The configuration considered contains two amplifiers, of which in each case only ever one is intended to effect an amplification.

In the example considered, the amplifiers are formed by a first transistor T1 and a second transistor T2. The transistors are dual-gate MOSFETs (Metal Oxide Semiconductor Field Effect Transistor) in the example considered.

It is noted that the amplifiers can also be formed by any other devices including transistors or other elements or a plurality of transistors or elements.

The transistors T1 and T2 each have a source terminal S, a drain terminal D, a first gate terminal G1, and a second gate terminal G2, the first gate terminals G1 in each case serving for inputting the signals to be amplified, and the second gate terminals G2 serving for regulating the gain.

The configuration shown has external input and/or output terminals A1, A2, E1, E2, and 0. Of these terminals, the terminal E1 serves for inputting the signal that is to be amplified by the first transistor T1, and for controlling the changeover between the transistors T1 and T2, the terminal E2 serves for inputting the signal that is to be amplified by the second transistor T2, the terminal A1 serves for inputting a supply voltage that is applied inter alia to the drain terminal of the first transistor T1, and for outputting the signal amplified by the first transistor T1, the terminal A2 serves for inputting a supply voltage that is applied inter alia to the drain terminal of the second transistor T2, and for outputting the signal amplified by the second transistor T2, the terminal G2 serves for inputting a control voltage that is applied to the second gate terminals G2 of the transistors T1 and T2 and serves for gain setting, and the terminal 0 serves for inputting the ground potential that is applied inter alia to the source terminals S of the transistors T1 and T2.

The remaining components of the configuration shown in the FIGURE, i.e. transistors H1, H2 and S1 and resistors $R_{H1}$, $R_{H2}$, $R_{E1a}$, $R_{E1b}$, $R_{E2a}$ and $R_{E2b}$, serve inter alia (but not exclusively) for putting the transistors T1 and T2, through suitable operating-point setting, into a state in which signals applied to the first gate terminal G1 of the relevant transistors are (can be) amplified, or, through suitable operating-point adjustment, into a state in which signals applied to the first gate terminal G1 of the relevant transistors are not (cannot be) amplified.

In the example considered, the operating-point setting or the operating-point adjustment is realized by virtue of the fact that DC voltages are applied to the first gate terminals G1 of the transistors T1 and T2, the level of which DC voltages is variable.

The fact that, in particular when the signals to be amplified are analog AC voltages, the operating point of the relevant transistor is adjustable or variable by the application of a DC voltage to the gate terminal of the transistor is known and needs no further explanation.

The signals to be amplified by the transistors T1 and T2 are radiofrequency signals in the example considered. However, it shall be pointed out that this need not necessarily be the case.

As has already been mentioned above, the signals to be amplified are input via the terminals E1 and E2, respectively. They are conducted via capacitors (not shown in the FIGURE) connected upstream of the terminals E1 and E2, in order to remove a direct-current component that may be present.

The signals to be amplified which are input via the terminal E1 are fed to the first gate terminal G1 of the first transistor T1. In order that these signals are optimally amplified by the transistor T1, the latter must be set to a suitable operating point by the application of a predetermined DC voltage to the first gate terminal G1. In the example considered, the DC voltage required for this purpose (for example 1.5 V) is generated internally within the relevant configuration using the resistors $R_{H1}$, $R_{E1a}$ and $R_{E1b}$ and the transistor H1 from the supply voltage applied to the drain terminal D of the first transistor T1 and is fed to the first gate terminal G1 of the transistor T1.

If the DC voltage present at the gate terminal G1 of the first transistor T1 deviates from the ideal value (for example the 1.5 V), the transistor T1 firstly "only" no longer optimally amplifies the RF signal fed to it, and finally (for example in the case of DC voltages below 0.5 V) no longer amplifies it at all.

The signals to be amplified which are input via the terminal E2 are fed to the first gate terminal G1 of the second transistor T2. In order that these signals are optimally amplified by the transistor T2, the latter must also be set to a suitable operating point by the application of a predetermined DC voltage to the first gate terminal G1. In the example considered, the DC voltage required for this purpose (for example 1.5 V) is generated internally within the relevant configuration using the resistors $R_{H2}$, $R_{E2a}$ and $R_{E2b}$ and the transistor H2 from the supply voltage applied to the drain terminal D of the first transistor T2 and is fed to the first gate terminal G1 of the transistor T2.

If the DC voltage present at the gate terminal G1 of the second transistor T2 deviates from the ideal value (for example the 1.5 V), the transistor T2 firstly "only" no longer optimally amplifies the RF signal fed to it, and finally (for example in the case of DC voltages below 0.5 V) no longer amplifies it at all.

In the configuration considered, the transistor S1, in particular, ensures that only either the transistor T1 or the transistor T2 amplifies the signals fed thereto. This is achieved by virtue of the fact that, when a DC voltage is present at the first gate terminal G1 of the first transistor T1, which voltage enables the first transistor T1 to amplify signals input via the terminal E1, the DC voltage present at the first gate terminal G1 of the second transistor T2 is brought to a value which has the effect that it cannot amplify the signals input via the terminal E2, or that, when the DC voltage present at the first gate terminal G1 of the first transistor T1 is brought to a value which has the effect that it cannot amplify the signals input via the terminal E1, the DC voltage present at the first gate terminal G1 of the second transistor T2 is left at the value which enables the second transistor T2 to amplify signals input via the terminal E2.

The transistor S1 is a switching element having a controlled path and a control terminal. The controlled path is its drain-source path, and the control terminal, which controls the switching state of the controlled path, is the gate terminal of the transistor S1. The gate terminal G of the transistor S1, via which the abovementioned mode of operation is realized, is connected to the first gate terminal G1 of the first transistor T1 via the resistors $R_{E1a}$ and $R_{S1}$. As a result, the DC voltage present at the first gate terminal G1 of the first transistor T1 is also present at the gate terminal of the transistor S1. This does not apply to the RF signals input via the terminal E1; these signals cannot pass through the resistors $R_{E1a}$ and $R_{S1}$. The drain terminal of the transistor S1 is connected to the gate terminal G1 of the amplifier transistor T2 via the resistor $R_{E2a}$. The source terminal of the transistor S1 is connected to the ground or reference-ground potential terminal 0. The control terminal via which the switching state of the drain-source path of the transistor S1 can be controlled is connected to the gate terminal G1 of the amplifier transistor T1 via the resistor RS1 and also via the further resistor RE1a.

The transistor S1 is configured, then, in such a way
that it is put into the on state (conducting state) by the DC voltage which must be established at the first gate terminal G1 of the transistor T1 in order to amplify the signals input via the terminal E1, and
that it is put into the off state (blocking state) by the DC voltage at which the transistor no longer amplifies the signals input via the terminal E1.

If and as long as the transistor S1 is in the on state, the first gate terminal G1 of the second transistor T2 is connected to the ground terminal 0 via the resistor $R_{E2a}$ and the transistor S1. As a result, the DC voltage established at the first gate terminal of the second transistor T2 falls to a value which has the consequence that signals input via the terminal E2 are not amplified (cannot be amplified) by the transistor T2.

If and as long as the transistor S1 is in the off state, the DC voltage, generated from the supply voltage input via the terminal A2, at the first gate terminal G1 of the second transistor T2 maintains its value unchanged, as a result of which the transistor T2 is able to amplify signals input via the terminal E2.

In order that the DC voltage present at the first gate terminal G1 of the first transistor T1 is brought to a value which has the consequence that the first transistor T1 no longer amplifies signals input via the terminal E1 (can no longer amplify the signals on account of the associated operating-point adjustment), the terminal E1 is pulled to ground potential in direct-current terms via a switch or in any other desired way. As a result, the DC voltage established at the first gate terminal G1 of the first transistor T1 falls to a value which has the consequence that signals input via the terminal E1 are not amplified (cannot be amplified) by the transistor T1, and that the transistor S2 turns off.

In the manner described, without the provision of a dedicated changeover terminal, it is possible to achieve the situation in which, of the transistors T1 and T2, only ever one is in a state in which it amplifies applied signals.

The possibility of dispensing with a dedicated changeover terminal enables the configuration to be realized with a minimal outlay. At the same time, the amplifiers are not disturbed in any way whatsoever.

For the sake of completeness, it shall be noted that the dual function of the terminals A1 and A2 (feeding in of the supply voltage and outputting of the amplified signals) does not pose any problems. The supply voltages are DC voltages which are fed to the terminals A1 and A2 via coils (not shown in the FIGURE) connected upstream thereof. By contrast, the amplified signals are RF signals which are tapped off between the terminals A1 and A2 and the coils connected upstream thereof and are coupled out (preferably via a capacitor). The supply voltages and the amplified signals do not influence one another and can be isolated from one another without any problems.

Furthermore, it shall be pointed out that the configuration described undoubtedly does not represent the only possibility for realizing the principle underlying the changeover described. This should be apparent and does not require verification by examples.

With regard to the configuration considered in the present case, it should be noted that the DC voltages present at the first gate terminals of the transistors T1 and T2 may also originally have values at which the transistors T1 and T2 are unable to amplify the signals to be amplified, and/or that the DC voltages which have to be applied to the first gate terminals of the transistors T1 and T2 in order to enable them to amplify the signals to be amplified can also be input via the terminal E1 or be generated by the transistor S1 or in some other way and/or be switched through to the relevant gate terminal, that it is not necessarily the level of the DC voltage established at the first gate terminal of the first transistor that has to be decisive for the operation of the second transistor, rather, in addition or as an alternative, it is also possible to take account of other conditions (for example the time profile and/or the frequency of the voltage present at the first gate terminal of the first transistor T1), that, instead of the resistors $R_{H1}$ and $R_{H2}$ and the transistors H1 and H2, it is also possible to use other ways of impressing currents (current mirroring is effected at the transistors H1 and H2 connected downstream of the resistors $R_{H1}$ and $R_{H2}$), and that the resistors $R_{E1a}$, $R_{E2a}$ and $R_{S1}$ can also assume the value 0 Ω if $R_{E1a} << (R_{E1b} + R_{H1})$ is satisfied.

Independently of this, provision may also be made for enabling the DC voltages at the gate terminals of the transistors T1 and T2 to be altered, in addition or as an alternative, depending on voltages or signals input via other terminals from among those present (for example depending on a voltage input via the terminal G2) and/or depending on internal signals and/or depending on logic combinations of internal and/or external signals.

The configuration described makes it possible, independently of the details of the practical realization, that the changeover between the amplifiers (formed by the transistors T1 and T2 in the present case) can be effected with minimal outlay and without disturbing these amplifiers.

We claim:

1. A circuit configuration, comprising:
   a first amplifier having a first controlled path connected to ground and a first terminal for receiving a signal to be amplified;
   a second amplifier having a second controlled path connected to ground and a second terminal for receiving a signal to be amplified; and
   a switching element having a switched path with a first side connected to ground and with a second side connected to one of said first and second terminals, said switched path of said switching element being configured to be controllable by a signal present at another one of said first and second terminals.

2. The circuit configuration according to claim 1, wherein said second amplifier is configured to be operated in dependence on one of a voltage level and a voltage profile established at said first terminal of said first amplifier.

3. The circuit configuration according to claim 1, wherein:
   said first and second amplifiers are configured to amplify analog AC voltages; and
   said second amplifier is configured to be operated in dependence on a DC voltage level established at said first terminal of said first amplifier.

4. The circuit configuration according to claim 3, wherein said first and second amplifiers are configured such that a DC voltage established at said second terminal of said second amplifier is varied depending on the DC voltage level established at said first terminal of said first amplifier.

5. The circuit configuration according to claim 1, including a DC voltage generating circuit connected to said first terminal of said first amplifier and to said second terminal of said second amplifier for providing DC voltages to said first and second terminals.

6. The circuit configuration according to claim 5, wherein said DC voltage generating circuit generates the DC voltages with given values such that said first and second amplifiers are enabled to amplify signals to be amplified.

7. The circuit configuration according to claim 3, wherein said first and second amplifiers are configured such that, if a DC voltage established at said first terminal of said first amplifier has a given value at which signals to be amplified by said first amplifier can be amplified, then a DC voltage established at said second terminal of said second amplifier is left at or brought to a value at which the second amplifier is unable to amplify signals to be amplified.

8. The circuit configuration according to claim 3, wherein said first and second amplifiers are configured such that, if a DC voltage established at said first terminal of said first amplifier has a given value at which said first amplifier is unable to amplify signals to be amplified, then a DC voltage established at said second terminal of said second amplifier is left at or brought to a value at which said second amplifier is able to amplify signals to be amplified.

9. The circuit configuration according to claim 3, wherein said first amplifier is configured such that a DC voltage established at said first terminal of said first amplifier is adjustable via said first terminal for receiving signals to be amplified by said first amplifier.

10. The circuit configuration according to claim 1, wherein:
    said first amplifier is a first transistor and said second amplifiers is a second transistor; and
    said first amplifier has a gate terminal, said second transistor is configured to be operated in dependence of one of a voltage level and a voltage profile established at said gate terminal of said first transistor.

11. The circuit configuration according to claim 1, wherein:
    said first amplifier is a first transistor and said second amplifiers is a second transistor;
    each of said first and second transistors has a first gate terminal, a second gate terminal and a controlled path;
    said first gate terminal of said first transistor forms said first terminal for receiving a signal to be amplified, said first gate terminal of said second transistor forms said second terminal for receiving a signal to be amplified;
    said second gate terminal is a terminal for setting a gain;
    further transistors are respectively assigned to said first and second amplifiers;
    each of said further transistors has a controlled path and two gate terminals;
    said first and second gate terminals of said first and second transistors are coupled to respective ones of said two gate terminals of said further transistors; and said controlled path of each of said further transistors is connected to ground and coupled to said controlled path of a respectively assigned one of said first and second amplifiers.

12. The circuit configuration according to claim 11, including:

two series circuits, each of said series circuits including two resistors and a node between said two resistors;

said first and second terminals of said first and second amplifiers being coupled to respective ones of said two gate terminals of said further transistors via said two series circuits; and said switching element having a control terminal, said switched path of said switching element and said control terminal of said switching element being respectively coupled to said node of a respective one of said two series circuits.

* * * * *